(12) United States Patent
Harel et al.

(10) Patent No.: US 8,351,882 B2
(45) Date of Patent: *Jan. 8, 2013

(54) AMPLIFYING A TRANSMIT SIGNAL USING A FRACTIONAL POWER AMPLIFIER

(75) Inventors: Haim Harel, New York, NY (US); Yair Karmi, Bridgewater, NJ (US)

(73) Assignee: Google Inc., Mountain View, CA (US)

( * ) Notice: Subject to any disclaimer, the term of this patent is extended or adjusted under 35 U.S.C. 154(b) by 802 days.

This patent is subject to a terminal disclaimer.

(21) Appl. No.: 12/278,994

(22) PCT Filed: Nov. 2, 2006

(86) PCT No.: PCT/US2006/042957
§ 371 (c)(1),
(2), (4) Date: Nov. 17, 2008

(87) PCT Pub. No.: WO2007/056137
PCT Pub. Date: May 18, 2007

(65) Prior Publication Data
US 2009/0209214 A1 Aug. 20, 2009

Related U.S. Application Data

(60) Provisional application No. 60/803,525, filed on May 31, 2006.

(51) Int. Cl.
*H01Q 11/12* (2006.01)

(52) U.S. Cl. .... 455/127.3; 455/69; 455/574; 455/127.5; 455/101; 455/552.1; 455/343.2; 330/51; 330/302; 369/47.21; 369/47.1; 369/53.2; 375/299; 375/224; 375/146; 370/332

(58) Field of Classification Search ............ 455/69, 455/574, 127.3, 127.5, 101, 103, 114, 552.1, 455/343.2; 330/51, 302; 369/47.21, 47.1, 369/53.2; 375/299, 224, 146; 370/332
See application file for complete search history.

(56) References Cited

U.S. PATENT DOCUMENTS

| | | | |
|---|---|---|---|
| 5,642,353 A | 6/1997 | Roy, III et al. | |
| 5,832,044 A | 11/1998 | Sousa et al. | |
| 5,862,461 A * | 1/1999 | Yoshizawa et al. | ........ 455/127.3 |
| 5,991,330 A | 11/1999 | Dahlman et al. | |

(Continued)

FOREIGN PATENT DOCUMENTS
EP 0 986 193 3/2000

(Continued)

OTHER PUBLICATIONS

International Search Report for International Application No. PCT/US06/42957 mailed on May 21, 2008.

(Continued)

*Primary Examiner* — April G Gonzales

(74) *Attorney, Agent, or Firm* — Gottlieb, Rackman & Reisman, PC.

(57) ABSTRACT

A transmit amplifier stage operable to amplify a transmit signal comprises power amplifiers and switches. The power amplifiers include at least one fractional power amplifier operable to provide fractional power to amplify the transmit signal, where the fractional power is a fraction of the full power. A switch has a plurality of positions, where a position directs the transmit signal to a selected power amplifier.

29 Claims, 2 Drawing Sheets

U.S. PATENT DOCUMENTS

| | | | | |
|---|---|---|---|---|
| 5,999,826 | A | 12/1999 | Whinnett | |
| 6,151,328 | A | 11/2000 | Kwon et al. | |
| 6,185,440 | B1 | 2/2001 | Barratt et al. | |
| 6,226,509 | B1 | 5/2001 | Mole et al. | |
| 6,236,363 | B1 | 5/2001 | Robbins et al. | |
| 6,330,294 | B1 | 12/2001 | Ansbro et al. | |
| 6,343,218 | B1 | 1/2002 | Kaneda et al. | |
| 6,392,988 | B1 | 5/2002 | Allpress et al. | |
| 6,397,090 | B1* | 5/2002 | Cho | 455/574 |
| 6,492,942 | B1 | 12/2002 | Kezys | |
| 6,636,495 | B1 | 10/2003 | Tangemann | |
| 6,704,370 | B1 | 3/2004 | Chheda et al. | |
| 6,745,009 | B2 | 6/2004 | Raghothaman | |
| 6,810,264 | B1 | 10/2004 | Park et al. | |
| 6,859,643 | B1* | 2/2005 | Ma et al. | 455/101 |
| 6,882,228 | B2 | 4/2005 | Rofougaran | |
| 7,209,720 | B2* | 4/2007 | Balasubramaniyan et al. | 455/127.5 |
| 7,321,636 | B2* | 1/2008 | Harel et al. | 375/299 |
| 7,515,877 | B2* | 4/2009 | Chen et al. | 455/69 |
| 7,965,987 | B2* | 6/2011 | Harel et al. | 455/69 |
| 2003/0002594 | A1* | 1/2003 | Harel et al. | 375/299 |
| 2003/0112880 | A1 | 6/2003 | Walton et al. | |
| 2004/0048584 | A1 | 3/2004 | Vaidyanathan et al. | |
| 2004/0085239 | A1 | 5/2004 | Ukena et al. | |
| 2005/0059355 | A1 | 3/2005 | Liu | |
| 2005/0143024 | A1 | 6/2005 | Sung et al. | |
| 2005/0143113 | A1 | 6/2005 | Lee et al. | |
| 2005/0254373 | A1* | 11/2005 | Wu et al. | 369/47.21 |
| 2006/0267682 | A1* | 11/2006 | Grebennikov | 330/51 |
| 2007/0218849 | A1* | 9/2007 | Harel et al. | 455/127.3 |

FOREIGN PATENT DOCUMENTS

| | | |
|---|---|---|
| EP | 1 191 707 | 3/2002 |
| EP | 1 282 242 | 2/2003 |
| EP | 1 282 244 | 2/2003 |
| EP | 1 284 545 | 2/2003 |
| EP | 1 262 031 | 5/2004 |
| GB | 2 353 437 | 2/2001 |
| JP | 09-238098 | 9/1997 |
| JP | 2000-151484 | 5/2000 |
| WO | WO 97/24818 | 7/1997 |
| WO | WO 00/79701 | 12/2000 |
| WO | WO 01/69814 | 9/2001 |
| WO | WO 03/090378 | 10/2003 |
| WO | WO 03/090386 | 10/2003 |
| WO | WO 2004/045108 | 5/2004 |
| WO | WO 2005/081444 | 9/2005 |

OTHER PUBLICATIONS

Derryberry et al., "Transmit Diversity in 3G CDMA Systems", Wideband Wireless Access Technologies to Broadband Internet, IEEE Communications Magazine, Apr. 2002, pp. 68-75.

Rashid-Farrokhi, et al., "Transmit Beamforming and Power Control for Cellular Wireless Systems", IEEE Journal on Selected Areas in Communications, vol. 16, No. 8, Oct. 1998, pp. 1437-1450.

* cited by examiner

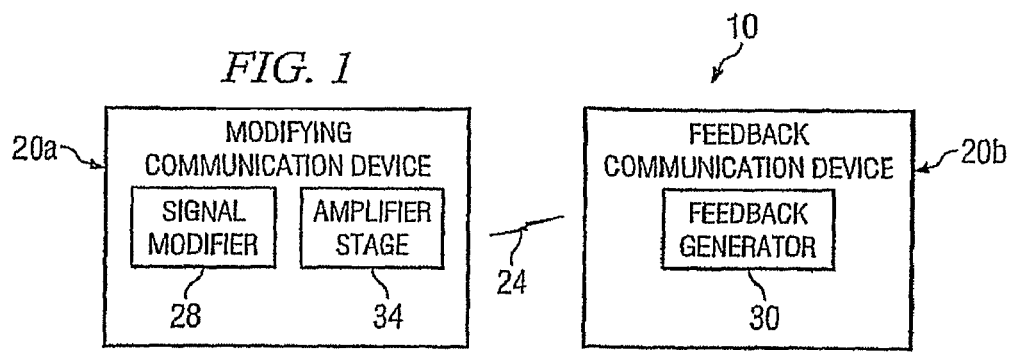
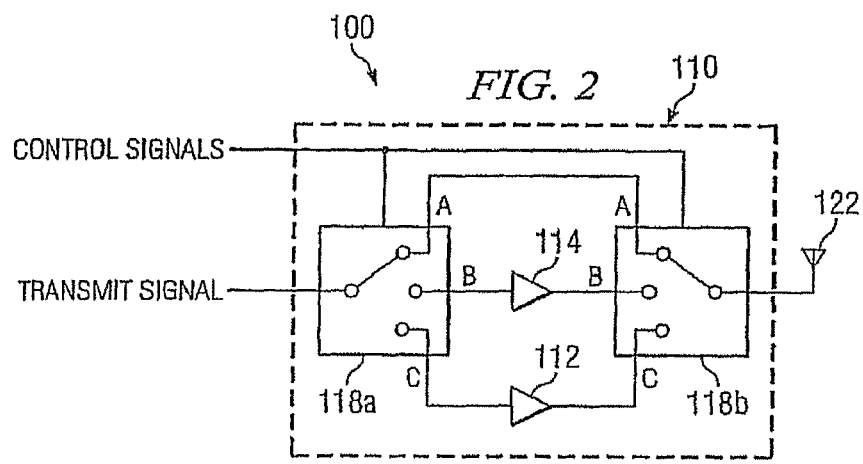
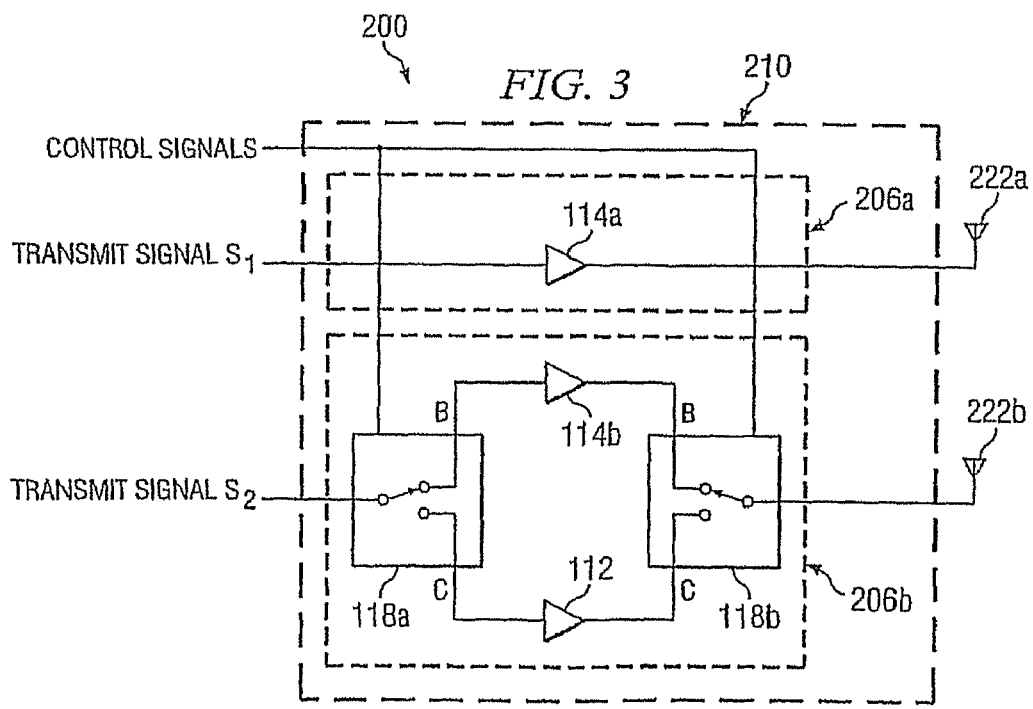

AMPLIFYING A TRANSMIT SIGNAL USING A FRACTIONAL POWER AMPLIFIER

CROSS-REFERENCE TO RELATED APPLICATIONS

This application is a National Phase Application of PCT International Application No. PCT/US2006/042957, entitled "AMPLIFYING A TRANSMIT SIGNAL USING A FRACTIONAL POWER AMPLIFIER", International Filing Date Nov. 2, 2006, published on May 18, 2007 as International Publication No. WO 2007/056137, which in turn claims priority from U.S. patent application Ser. No. 11/268,260, filed Nov. 3, 2005 and U.S. Provisional Patent Application No. 60/803,525, filed May 31, 2006, all of which are incorporated herein by reference in their entirety.

TECHNICAL FIELD

This invention relates generally to the field of wireless communications and more specifically to amplifying a transmit signal using a fractional power amplifier.

BACKGROUND

A transmitting communication device may have multiple antenna elements that transmit signals to communicate information. A receiving communication device extracts the information from the transmitted signals. Multiple antenna elements may enhance spectral efficiency, allowing for more users to be simultaneously served over a given frequency band.

Generally, transmit diversity techniques may involve transmitting radio frequency (RF) power through at least two channels. However, using the same full power amplifier for each RF channel may not be power efficient because the amplifier stage may output RF power below the rated power for some of the time of operation. Amplifying the signals for transmission, therefore, may burden the power source of the transmitting communication device.

SUMMARY OF THE DISCLOSURE

In accordance with the present invention, disadvantages and problems associated with previous techniques for amplifying signals may be reduced or eliminated.

Embodiments of the present invention may contain a transmit amplifier stage operable to amplify a transmit signal, that may comprise power amplifiers and switches. The power amplifiers may include at least one full power amplifier operable to provide full power to amplify the transmit signal and may include at least one fractional power amplifier operable to provide fractional power to amplify the transmit signal, where the fractional power is a fraction of the full power. In some embodiments of the present invention, full power may refer to power operable to support an air interface using a single transmit antenna. In embodiments of the invention, a switch may have a plurality of positions, where each or any position, for example, may direct the transmit signal to a selected power amplifier.

Certain embodiments of the invention may provide one or more technical advantages. For example, a technical advantage of one embodiment may be that a transmit amplifier stage includes a fractional power amplifier, which may be selected to amplify a transmit signal with a fractional power output. In some embodiments of the invention, the fractional power amplifier may consume less power than a full power amplifier for the same power output, so that the power consumption may be decreased. In some embodiments of the invention, similar transmit amplifier stages may be used to amplify multiple transmit signals to be transmitted from multiple antennas. The multiple transmit signals may be used to perform a transmit diversity operation, which may compensate for multipath fading and suppress interference signals. It will be recognized that different embodiments of the invention may support none, some, or all of the above technical advantages, and that the invention is not limited by the recitation herein of any certain advantages of the invention. One or more additional or other technical advantages may be readily apparent to one skilled in the art from the figures, descriptions, and claims included herein.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 is a block diagram illustrating a communication network that includes a modifying communication device comprising one embodiment of an amplifier stage operable to amplify a signal;

FIG. 2 is a block diagram illustrating one embodiment of a transmitter output stage that includes an amplifier stage operable to amplify a signal;

FIG. 3 is a block diagram illustrating one embodiment of a transmitter output stage that includes an amplifier stage operable to amplify a plurality of signals;

Figure 4:
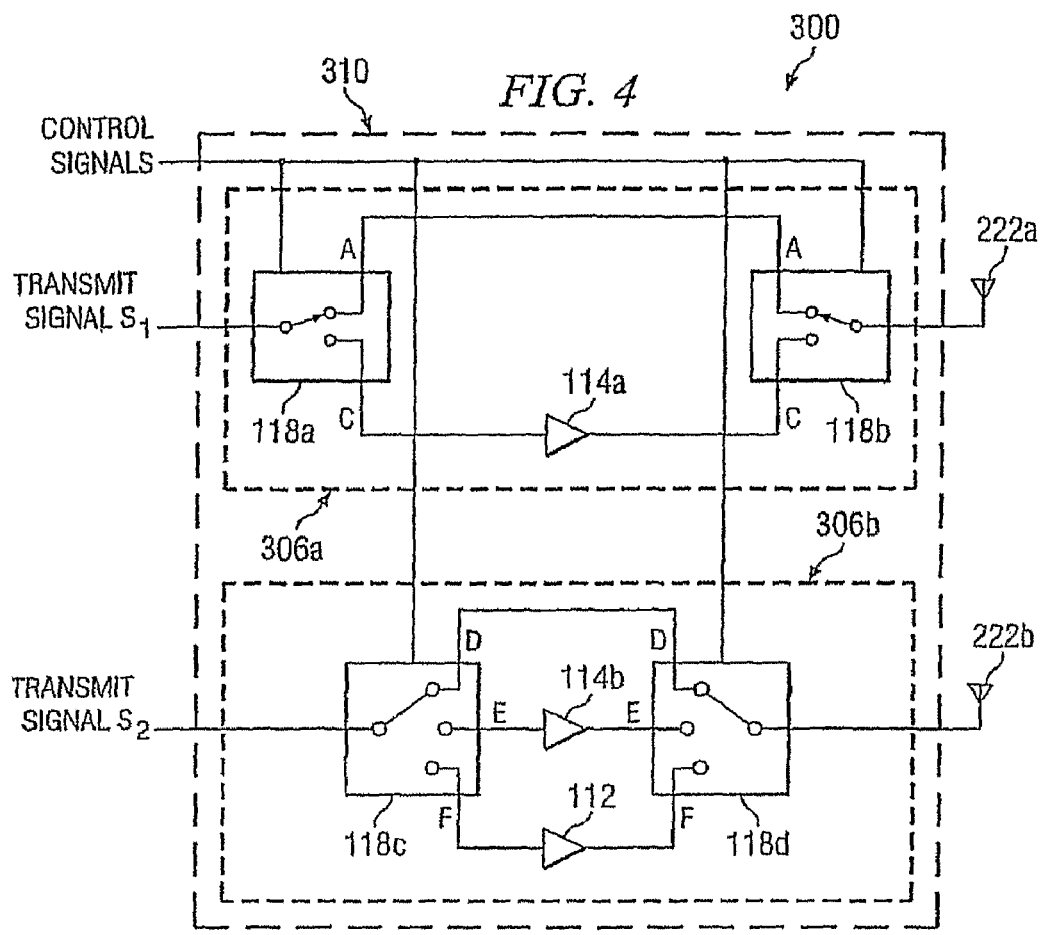
FIG. 4 is a block diagram illustrating another embodiment of a transmitter output stage that includes an amplifier stage operable to amplify a plurality of signals.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

According to embodiments of the invention, transmit diversity techniques may use fractional power amplifiers. In operation, lower total power than full power may be required, but there may be instances when transmit diversity is not effective. In such instances, for example, either more power may be required, or single channel full power may be preferred.

According to one embodiment of the invention, there may be provided at least a fractional power amplifier, or in some embodiments of the invention a plurality of power amplifiers including a fractional power amplifier, and a switching arrangement such that none, one, selected some or all amplifiers may be enabled and none, one, some or all amplifiers may be bypassed. If the power level at the input to the power amplifier is sufficiently high, the power amplifier may be bypassed, saving its operating current. The current typically drawn by a bypass switch may be much smaller than the quiescent current of the power amplifier. The current savings may apply to each power amplifier of the multiple power amplifiers.

The quiescent current of an amplifier may refer to the current that the amplifier draws from the power supply when the output power of the amplifier is small or minimal, for example, for a minimum signal input. The quiescent current, which may be proportional to the amplifier rated power, may contribute to the total current required by the amplifier at low signal levels. Thus, the higher the quiescent current, the lower the amplifier efficiency when averaged over the statistics of used levels of the amplifier, or the probability of different transmit power levels.

Power amplifiers may be subject to variable efficiency of the device, which may degrade as a function of the power output. For example, the efficiency (PAE) at a maximum power level may be three to four times better than the efficiency at a medium power level, and the efficiency may be lower at a low power level. The variable efficiency is partly due to the quiescent current, which may have a contribution to overall consumption for all power outputs.

Variable efficiency may negatively affect transmit diversity techniques. For example, while operating at relatively high power levels, the simultaneous usage of two power amplifier devices of a transmit diversity device may require less total power output, and thus less current consumption, than a single full power amplifier stage of a single channel transmit device, which may provide a current consumption advantage. The current consumption advantage, however, may be compromised when operating in medium or low power outputs. Due to reduced amplifier efficiency, the reduction of required power output may no longer be translated to a reduction of current consumption. Accordingly, in some embodiments of the invention, a bypass power amplifier technique, which may nullify or significantly reduce the quiescent current, may yield current consumption saving for power levels ranging from high, medium, and low power levels.

According the some embodiments of the invention, there may be provided a transmit path having at least one fractional or full power amplifier, and at least one bypass switch so as to select the fractional or full power amplifier or to select a bypass path bypassing the amplifier. It will be understood that the fractional or full power amplifier may be a single or multiple stage amplifier. Combinations are possible, for example, in one embodiment of the invention, a transmit path having a multiple stage amplifier, in which some stages may be bypassed by a bypass switch directing the transmit path to a bypass path bypassing the partial stage of the multiple stage amplifier. A transmit path having a multiple stage amplifier may have a plurality of bypass switches each to bypass a selected subset of stages. It will be further understood that in an embodiment of the invention, a transmit diversity device may have one, some or all transmit paths with a full or partial bypass arrangement.

FIG. 1 depicts a block diagram of one embodiment of a communication network 10 that may include a modifying communication device 20a. Said modifying communication device 20a may include an amplifier stage 34. Said amplifier stage 34 may include a full power amplifier, a fractional power amplifier, or both a full power amplifier and a fractional power amplifier. The fractional power amplifier may be selected to amplify a transmit signal using a fractional power. In some embodiments of the invention, the fractional power amplifier may consume less power than a full power amplifier, and the power consumption of the amplifier stage may thus be decreased.

In some embodiments of the present invention, modifying communication device 20a may implement a diversity control operation. Modifying communication device 20a may apply a diversity parameter adjustment to a signal transmitted to feedback communication device 20b. Feedback communication device 20b may return feedback information that may describe the signal as received by feedback communication device 20b. Modifying communication device 20a may determine a next diversity parameter adjustment in accordance with the feedback information.

In some embodiments of the present invention, network 10 may operate to provide services, for example, communication sessions. A communication session may refer to an active communication between endpoints, as measured, for example, from endpoint to endpoint. Information, for example, voice, data, text, audio, video, multimedia, control, signaling, other information, or any combination of the preceding, may be communicated during a communication session.

A base station may provide a subscriber unit access to a communication network that allows the subscriber unit to communicate with other networks or devices. A base station may typically include a base transceiver station and a base station controller. The base transceiver station may communicate signals to and from one or more subscriber units. The base station controller may manage the operation of the base transceiver station.

Information may be communicated, for example, in packets, where a packet may comprise a bundle of data organized in a specific way for transmission. A frame may comprise the payload of, for example, one or more packets organized in a specific way for transmission. A packet-based communication protocol such as, for example, Internet Protocol (IP) may be used to communicate the packets. A packet may comprise any suitable packet, such as, for example, a General Packet Radio Service (GPRS) packet, or, for example, an Enhanced Data for GSM Evolutions (EDGE) packet, or any other suitable packet.

In some embodiments network 10 may utilize communication protocols and technologies to provide the communication sessions. Communication protocols and technologies may include, for example, those of the Institute of Electrical and Electronics Engineers (IEEE) 802.xx standards and other IEEE standards, International Telecommunications Union (ITU-T) standards including, for example, the IMT-2000 standards, European Telecommunications Standards Institute (ETSI) standards including, for example, the HIPERLAN and HIPERLAN2 local area network standards, Internet Engineering Task Force (IETF) standards, Third Generation Partnership Project (3GPP) or 3GPP2 standards, or other standards.

In some embodiments devices of network 10 may use any suitable access technology, for example, frequency division duplex (FDD), time division duplex (TDD), code division multiple access (CDMA), or orthogonal frequency division multiplex (OFDM) technology. In some embodiments, network 10 may operate, for example, according to a CDMA 2000 telecommunications technology that may use a single CDMA channel. For example, a CDMA 2000 high rate data packet technology such as the Evolution Data Only (EvDO) technology may be used.

In some embodiments network 10 may comprise any suitable communication network. A communication network may comprise all or a portion of, for example, a public switched telephone network (PSTN), a public or private data network, a local area network (LAN), a metropolitan area network (MAN), a wide area network (WAN), a wireline or wireless network, a local, regional, or global communication network such as, for example, the Internet, an enterprise intranet, other suitable communication link, or any combination of the preceding.

In some embodiments network 10 may include one or more modifying communication devices 20*a* and one or more feedback communication devices 20*b* that may communicate via a wireless link 24. A communication device 20 may represent any device operable to communicate information via signals with one or more other communication devices 20. For example, communication device 20 may comprise a subscriber unit or a base station. A subscriber unit may comprise any device operable to communicate with a base station, for example, a personal digital assistant, a cellular telephone, a mobile handset, a computer, or any other device suitable for communicating signals to and from a base station. A subscriber unit may support, for example, Session Initiation Protocol (SIP) or any other suitable communication protocol.

In some embodiments a communication device 20 may include one or more antenna elements, where each antenna element may be operable to receive, transmit, or both receive and transmit a signal. Wireless link 24 between communication devices 20*a* and 20*b* may be a radio frequency link that may be used to communicate a signal between communication devices 20*a* and 20*b*.

In some embodiments modifying communication device 20*a* may include a signal modifier 28 that may modify one or more signals in accordance with feedback information that may be received from feedback communication device 20*b*. In some embodiments modifying a signal may be described, as applying a diversity parameter adjustment, for example, an absolute power adjustment. Absolute power may refer to the total power transmitted by modifying communication device 20*a*.

In some embodiments a signal may be modified by applying a diversity parameter adjustment to the signal. In some embodiments, a next diversity parameter adjustment $\vec{f}(k+1)$ may be calculated from a current diversity parameter adjustment $\vec{f}(k)$ and a diversity parameter increment adjustment $\Delta \vec{f}(k)$ according to $\vec{f}(k+1) = \vec{f}(k) + \Delta \vec{f}(k)$, where k represents an iteration.

In some embodiments signal modifier 28 may use feedback information to determine a diversity parameter adjustment for a next window. The feedback information may indicate, for example, whether modifying communication device 20*a* should increase or reduce transmission power. Feedback information may be obtained from a feedback signal in any suitable manner.

In some embodiments, for example, signal modifier 28 may obtain feedback information from a quality indication signal that may be received from feedback communication device 20*b*. A quality indication signal may refer to a signal that describes a quality of a signal transmitted by modifying communication device 20*a* as received by feedback communication device 20*b*.

In some embodiments, for example, signal modifier 28 obtains feedback information from a control signal that may be generated by a baseband subsystem of modifying communication device 20*a*. A control signal may refer to a signal that may be derived from the feedback information and may provide instructions to a component of, for example, a communication device.

In some embodiments amplifier stage 34 may include a fractional power amplifier, or a full power amplifier and a fractional power amplifier. The fractional power amplifier may be selected to amplify a transmit signal using a fractional power. Some embodiments of amplifier stage 34 may be described with reference to FIGS. 2, 3, and 4, although it should not be construed that these are limiting descriptions.

In some embodiments feedback communication device 20*b* generates feedback information that reflects the quality of the received modified signals. The quality may be determined in any suitable manner. As an example, a higher signal-to-noise ratio (SNR), or energy per bit to the spectral noise density ($E_b N_o$), may indicate a higher signal quality. In other examples, the quality may be determined using any suitable measurements, for example, receive signal power ($P_R$), bit error rate (BER), frame error rate (FER), other measurement, or any suitable combination of the preceding. A higher received signal power, a lower bit error rate, or a lower frame error rate may indicate, for example, a higher signal quality.

In some embodiments feedback communication device 20*b* may include a feedback generator 30 that may generate feedback information that may depict the quality of the modified signals. The feedback information may include one or more quality indicators. In some embodiments a quality indicator may instruct modifying communication device 20*a* to increase or decrease transmission power. A quality indicator may comprise, for example, a power control bit (PCB) of a code division multiple access (CDMA) power control signal or, for example, a transmit power control bit (TPB) of a wideband code division multiple access (WCDMA) power control signal. The quality indicators may be sent to modifying communication device 20*a* via a quality indication signal. In some embodiments a quality indicator may identify specific diversity parameter values that are better than other diversity parameter values. For example, the quality indicators may indicate that a specific test that tests a specific diversity parameter vector is better than the other tests.

In some embodiments a device of network 10 may include logic, an interface, memory, other component, or any suitable combination of the preceding. Said logic may refer to hardware, software, other logic, or any suitable combination of the preceding. Certain logic may manage the operation of a device, and may comprise, for example, a processor. Said interface may refer to logic of a device operable to receive input for the device, send output from the device, perform suitable processing of the input or output or both, or any combination of the preceding, and may comprise one or more ports, conversion software, or both. Said memory may refer to logic operable to store and facilitate retrieval of information, and may comprise, for example, Random Access Memory (RAM), Read Only Memory (ROM), a magnetic drive, a disk drive, a Compact Disk (CD) drive, a Digital Video Disk (DVD) drive, removable media storage, any other suitable data storage medium, or any suitable combination of the preceding.

Modifications, additions, or omissions may be made to communication network 10 without departing from the scope of the invention. Additionally, operations of communication network 10 may be performed using any suitable logic. As used in this document, "each" refers to each member of a set or each member of a subset of a set. A subset of a set may include none, some, or all elements of the set.

FIG. 2 is a bloc diagram illustrating one embodiment of a transmitter (Tx) output stage 100 that includes an amplifier stage 110 operable to amplify a signal. In some embodiments, Tx output stage 100 may be used with modifying communication device 20a.

In one embodiment of the present invention, Tx output stage 100 may include power amplifier stage 110 and may include an antenna 122 that may be coupled as shown. Power amplifier stage 110 may receive a transmit signal through an input, amplify the signal, and may send the amplified signal through an output coupled to antenna 122. Power amplifier stage 110 may include a plurality of power amplifiers 112 and 114 and a plurality of switches 118a and 118b coupled as shown.

Power amplifier stage 110 may include any suitable number of power amplifiers, for example, amplifiers 112 and 114. A power amplifier may comprise any suitable amplifier operable to amplify a signal. For example, a power amplifier may comprise a radio frequency (RF) analog signal amplifier. The signal amplifier may be formed of one or more stages and may provide linear or non-linear amplification, for example, logarithmic amplification.

In one embodiment, power amplifiers 112 and 114 may include zero or more full power amplifiers 112 and one or more fractional power amplifiers 114. A full power amplifier 112 may represent a power amplifier that may provide fall power to amplify signals up to a specification power limit. According to embodiments of the invention, full power may refer to the maximum power required by a non-diversity device that yields a power level at the antenna input that satisfies the requirement of any suitable air interface standard. It will be recognized that full power may be higher than specified in a standard in order to account for losses between the amplifier output and the antenna input. For example, a power amplifier such as the AWT6135 power amplifier from ANADIGICS, INC., amplifies up to +28 dBm for CDMA2000. Full power amplifier 12 may be designed such that its maximum power efficiency may coincide with the full power output. Full power may be used at any suitable time, for example, when modifying communication device 20a is far from feedback communication device 20b.

A fractional power amplifier 114 may represent a power amplifier that provides fractional power to amplify signals up to a portion of a specification power limit. Fractional power may refer to any suitable portion, for example, one-half power, one-quarter power, or x/y power for any suitable x and y, where the ratio x/y may be less than or equal to one. Fractional power may be used at any suitable time, for example, during normal operation of modifying communication device 20a. Fractional power amplifier 114 may be designed such that its maximum power efficiency may coincide with the fractional power output. In some embodiments of the invention, the quiescent current of a fractional power amplifier may be a fraction of the quiescent current of a full power amplifier.

In some embodiments the rated power of fractional power amplifier 114 may be a fraction of the rated power of full power amplifier 112, so the power consumption of fractional power amplifier 114 may be proportionally lower that the power consumption of full power amplifier 112.

In one embodiment, fractional power amplifiers 114 may include a plurality of fractional power amplifiers 114. Fractional power amplifiers 114 may be placed in parallel, and may have the same or different fractional powers. A fractional power amplifier 114 may be selected by switches 118a and 118b controlled by control signals. Fractional power amplifiers 114 may amplify signals using different power levels.

In some embodiments switches 118a and 118b may represent RF switches that may steer signals to amplifier 112, amplifier 114, bypass path, or any suitable combination of the preceding. A switch 118a or 118b may have any suitable number m of positions. As an example, switch 118a or 118b may have m=n+1 positions to accommodate n amplifiers 112 and 114 and a bypass path. In one embodiment of FIG. 2, a switch 118 may have m=3 positions labeled A, B, and C. The A positions may direct a signal to a path that may bypass full power amplifier 112 and fractional power amplifier 114, the B positions may direct a signal to fractional power amplifier 114, and the C positions may direct the transmit signal to full power amplifier 112.

In some embodiments of the invention, bypassing a power amplifier while still maintaining the full transmit dynamic range of a transmitting chain may require adding an additional control to the power amplifier or changing the switching point currently controlling the state, e.g., the high/low power amplifier gain, of the power amplifier. According to one embodiment of the invention, modifying communication device 20a may include a vector modulator coupled between an upconverter and power amplifiers 112 and 114. Level shifting may be used to allow a current control sent from a baseband processor to a power amplifier 112 and 114 to bypass the power amplifier 112 and 114.

A control input of switch 118a or 118b receives a control signal. The control signal controls the position of switch 118a or 118b, and may be sent by a controller of modifying communication device 20a, for example, the MSM7500 chipset from QUALCOMM INCORPORATED. The control signal may, for example, represent a portion of a digital control bus or, for example, signals derived from a digital control bus.

Any suitable control signal may be used. According to one embodiment of the invention, the control signal may comprise a logic control signal such as a power amplifier state control signal. A state control signal that switches between amplification levels may be used to switch between an active power amplifier and a bypassed power amplifier. According to another embodiment of the invention, the control signal may comprise a logic signal derived from a multi-level control signal. For example, the control signal may comprise a transmit level signal that may control the output level of an upconverter, and that may be provided by a baseband controller. According to another embodiment of the invention, the control signal may comprise a separate logic control signal, for example, a signal from a baseband controller.

Antenna 122 may represent an RF antenna operable to receive, transmit, or both receive and transmit a signal. Antenna 122 may comprise, for example, a typical handset antenna, such as a retractable antenna.

Modifications, additions, or omissions may be made to power amplifier stage 110 without departing from the scope of the invention. The components of power amplifier stage 110 may be integrated or separated according to particular needs. For example, the present invention contemplates some or all of amplifiers 112 and 114 and switches 118a and 118b being provided at a single device, for example, a single integrated circuit. If any of the components of power amplifier stage 110 are separated, the separated components may be coupled using a bus or other suitable link. Moreover, the operations of power amplifier stage 110 may be performed by more, fewer, or other components. Additionally, operations of power amplifier stage 110 may be performed using any suitable logic.

FIG. 3 is a block diagram illustrating one embodiment of a transmitter (Tx) output stage 200 that may include an amplifier stage 210 operable to amplify a plurality of signals. According to one embodiment, Tx output stage 200 may be used with modifying communication device 20a.

In one embodiment, Tx output stage 200 may include power amplifier stage 210 and antennas 222a and 222b coupled as shown. Power amplifier stage 210 may receive transmit signals $S_1$ and $S_2$ through inputs, may amplify the signals, and may send the amplified signals through an output coupled to antennas 222a and 222b. Power amplifier stage 210 may comprise any suitable number of channels 206. According to the illustrated embodiment, channel 206a may amplify signal $S_1$, and channel 206b may amplify signal $S_2$. Channels 206a and 206b may comprise any suitable number n of power amplifiers 112 and 114 and may comprise a plurality of switches 118a and 118b coupled to a plurality of antennas 222 as shown. According to the illustrated embodiment, channel 206a may comprise fractional power amplifier 114a coupled to antenna 222a, and channel 206b may comprise fractional power amplifier 114b, full power amplifier 112, and switches 118a and 118b coupled to antenna 222b.

In one embodiment, a switch 118a or 118b may have m=2 positions, labeled B and C, which may accommodate fractional power amplifier 114b and full power amplifier 112. The B positions may direct a signal to fractional power amplifier 114b. The output of fractional power amplifiers 114b may be maximized by, for example, the setting of their internal gain, and the output of fractional power amplifiers 114b may be minimized by, for example, the setting of their internal gain. The C positions may direct a signal to full power amplifier 112.

Antennas 222a and 222b may represent RF antennas operable to receive, transmit, or both receive and transmit a signal. Antennas 222a and 222b may comprise, for example whip, chip, or slot antennas.

Modifications, additions, or omissions may be made to power amplifier stage 210 without departing from the scope of the invention. The components of power amplifier stage 210 may be integrated or separated according to particular needs. For example, the present invention contemplates some or all of amplifiers 112 and 114a and 114b and switches 118a and 118b being provided at a single device, for example, a single integrated circuit. If any of the components of power amplifier stage 210 are separated. the separated components may be coupled using a bus or other suitable link. Moreover, the operations of power amplifier stage 210 may be performed by more, fewer, or other modules. Additionally, operations of power amplifier stage 210 may be performed using any suitable logic.

FIG. 4 is a block diagram illustrating one embodiment of a transmitter (Tx) output stage 300 that may include an amplifier stage 310 operable to amplify a plurality of signals. According to one embodiment, Tx output stage 300 may be used with modifying communication device 20a.

In one embodiment of the present invention, as depicted in FIG. 4, Tx output stage 300 may include power amplifier stage 310 and antennas 222a and 222b coupled as shown. Power amplifier stage 310 may receive transmit signals $S_1$ and $S_2$ through inputs, may amplify the signals, and may send the amplified signals through an output coupled to antennas 222a and 222b. Power amplifier stage 210 may comprise any suitable number of channels 306a or 306b. According to the illustrated embodiment, channel 306a may amplify signal $S_1$, and channel 306b may amplify signal $S_2$. Channels 306a and 306b may comprise any suitable number n of power amplifiers 112 and 114a and 114b and a plurality of switches 118a, 118b, 118c, and 118d coupled to a plurality of antennas 222a and 222b as shown. According to the illustrated embodiment, channel 306a may comprise fractional power amplifier 114a and switches 118a and 118b coupled to antenna 222a, and channel 306b may comprise fractional power amplifier 114b, full power amplifier 112, and switches 118c and 118d coupled to antenna 222b.

According to the illustrated embodiment, switches 118a and 118b may have m=2 positions, labeled A and C, that may accommodate a bypass path and fractional power amplifier 114a. The A positions may direct a signal to the bypass path, and the C positions may direct a signal to fractional power amplifier 114a. Switches 118c and 118d may have m=3 positions, labeled D, E, and F. that may accommodate a bypass path, fractional power amplifier 114b, and full power amplifier 112. The A positions may direct a signal to the bypass path, the B positions may direct a signal to fractional power amplifier 114b, and the C positions may direct a signal to full power amplifier 112.

Antennas 222a and 222b may represent RP antennas operable to receive, transmit, or both receive and transmit a signal. Antennas 222a and 222b may comprise, for example whip, chip, or slot antennas.

Modifications, additions, or omissions may be made to power amplifier stage 310 without departing from the scope of the invention. The components of power amplifier stage 310 may be integrated or separated according to particular needs. For example, the present invention contemplates some or all of amplifiers 112 and 114a and 114b and switches 118a and 118b being provided using a single device, for example, a single integrated circuit. If any of the components of power amplifier stage 310 are separated, the separated components may be coupled using a bus or other suitable link. Moreover, the operations of power amplifier stage 310 may be performed by more, fewer, or other modules. Additionally, operations of power amplifier stage 310 may be performed using any suitable logic.

According to one embodiment, at any time one, some, or all of the transmit paths, whether going through the power amplifiers or bypassing the power amplifiers, may be activated. The activation of power amplifier bypass (any of 118a, 118b, 118c, 118d) may be based on the required transmit power level, and it may be controlled by any one or more of the following of one or more embodiments:

(1) An existing logic control signal, such as an existing power amplifier state control signal. An existing power amplifier state control signal may effectively switch a power amplifier between two amplification levels. The signal may be used to switch states between an active power amplifier state and a bypassed power amplifier state. In some embodiments of the invention, a software modification may be used to implement this example;

(2) A logic signal derived from a multi-level control signal, such as a transmit level signal provided by a baseband controller. The transmit level signal may primarily control the output level from the upconverter; and (3) A separate logic control signal, for example an additional output from the baseband.

It will be recognized that other implementations of the logic control may be implemented within the scope of the present invention.

Figure 5:
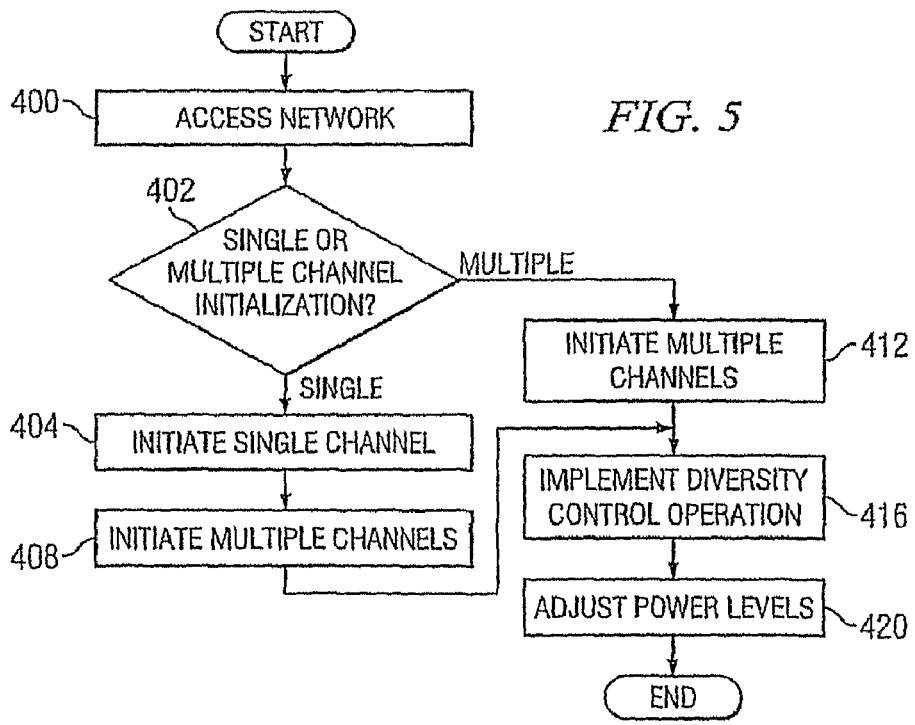
FIG. 5 is a flowchart illustrating one embodiment of a method for amplifying a signal that may be used by the amplifier stage of the modifying communication device of FIG. 1.

FIG. 5 is a flowchart illustrating one embodiment of a method for amplifying a signal that may be used by amplifier stage 34 of modifying communication device 20a of FIG. 1.

In this embodiment, the method begins at step 400, where a network comprising feedback communication device 20b may be accessed by modifying communication device 20a.

Single or multiple channel initialization may be performed at step 402. During initialization, any suitable combination of one or more amplifiers 112 and 114a and 114b may be utilized to amplify one or more transmit signals for transmission by one or more antennas 122 and 222a and 222b. In single channel initialization, a single antenna may transmit signals. In multiple channel initialization, multiple antennas may transmit signals, which may provide for diversity control.

If single channel initialization is to be performed at step 402, the method may proceed to step 404, where a single channel may be initialized. The initialization may be performed in any suitable manner. For example, a first signal may be directed to a bypass path, and a second signal may be directed to a full power amplifier 112 to yield fill transmit power. Multiple channels are initiated at step 412. The multiple channels may be initiated in any suitable manner. For example, a first signal may be directed to a first fractional power amplifier 114b, and a second signal may be directed to a second fractional power amplifier 114b to perform a diversity control operation. The method then proceeds to step 416.

If multiple channel initialization is to be performed at step 402, the method may proceed to step 412, where multiple channels may be initialized. The initialization may be performed in any suitable manner, for example, as described with reference to step 408. The method then proceeds to step 416.

A diversity control operation is implemented at step 416. Any suitable diversity control operation may be used. Power levels may be adjusted at step 424. Power levels may be adjusted in response to any suitable situation. For example, the power may be decreased if modifying communication device 20a moves closer to feedback communication device 20b. Power levels may be adjusted in any suitable manner, for example, in a manner described with reference to steps 404 or 412. After adjusting the power levels, the method terminates.

Modifications, additions, or omissions may be made to the method without departing from the scope of the invention. The method may include more, fewer, or other steps. Additionally, steps may be performed in any suitable order without departing from the scope of the invention.

In some embodiments, the multiple transmit signals may be used to perform a diversity control operation.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claim is:

1. A mobile wireless communication device comprising:
    a signal modifier in said mobile wireless communication device to receive an input signal and produce a first transmit signal differing by a phase difference from a second transmit signal; and
    a transmit amplifier stage in said mobile wireless communication device operable to amplify said first and second transmit signals, comprising:
        a first channel comprising at least one full power amplifier operable to provide power to amplify the first transmit signal for transmission by a first antenna at a full power, wherein a substantially maximum efficiency of the first power amplifier substantially coincides with the a specification power limit of the wireless device; and
        a second channel comprising at least one fractional power amplifier operable to amplify the second transmit signal for transmission by a second antenna at a fractional power, wherein a substantially maximum efficiency of the fractional power amplifier substantially coincides with the fractional power, the fractional power being a fraction of the specification power limit of the wireless device,
    wherein said signal modifier is further to produce said phase difference based on a feedback signal received from a receiver of said first and second transmit signals.

2. The wireless communication device of claim 1, wherein said second channel consists essentially of said fractional power amplifier.

3. The wireless communication device of claim 1, wherein said fractional power is less than half of said specification power limit of the wireless device.

4. The wireless communication device of claim 1, wherein said fractional power is a quarter of said specification power limit of the wireless device.

5. The wireless communication device of claim 1, wherein said first and second channels are operable to provide said respective first and second transmit signals for simultaneous transmission over the same frequency.

6. The mobile wireless communication device of claim 1, wherein the fractional power is one substantially one half of the specification power limit of the wireless device.

7. The wireless communication device of claim 1, wherein the first channel comprises a plurality of power amplifiers, each providing a different power amplification to said first transmit signal, and wherein said plurality of power amplifiers in said first channel includes said full power amplifier and a first channel fractional power amplifier operable to amplify the first transmit signal at a fractional power, wherein a substantially maximum efficiency of the first channel fractional power amplifier substantially coincides with a fraction of the specification power limit of the wireless device.

8. The wireless communication device of claim 7, wherein the fractional power of the fractional power amplifier in said first channel is less than half of said specification power limit of the wireless device.

9. The wireless communication device of claim 7, wherein the fractional powers of the fractional power amplifiers in said first and second channels are less than half of said specification power limit of the wireless device.

10. The wireless communication device of claim 7, wherein the fractional powers of the fractional power amplifies in said first and second channels are a quarter of said specification power limit of the wireless device.

11. The wireless communication device of claim 7, wherein one of the fractional powers of the fractional power amplifiers in said first and second channels is one half of said specification power limit of the wireless device, and the other of the fractional powers of the fractional power amplifiers in said first and second channels is one quarter of said specification power limit of the wireless device.

12. The wireless communication device of claim 7, wherein said first path further comprises a switch operable to select one of the plurality of power amplifiers to amplify said first transmit signal.

13. A method for transmission of a signal by a mobile wireless communication device, comprising:
    receiving an input signal for transmission;
    producing based on said input signal a first transmit signal differing by a phase difference from a second transmit signal;
    amplifying by a full power the first transmit signal for transmission by a first antenna, the full power being a specification power limit of the mobile wireless communication device, said amplification of the first transmit signal performed by a full power amplifier having a substantially maximum efficiency that substantially coincides with the full power;

amplifying by a fractional power the second transmit signal for transmission by a second antenna, the fractional power being a fraction of the specification power limit of the mobile wireless communication device, said amplification of the second transmit signal performed by a fractional power amplifier having a substantially maximum efficiency that substantially coincides with the fractional power;

transmitting by said mobile wireless communication device said amplified first and second transmit signals, thereby producing transmission of said input signal by said full transmission power;

receiving a feedback signal from a receiver of said first and second transmit signals; and producing said phase difference based on said feedback signal.

14. The method of claim 13, wherein said fractional power is less than half of the specification power limit.

15. The method of claim 13, wherein said fractional power is one quarter of the specification power limit.

16. The method of claim 13, wherein transmitting said amplified first and second transmit signals comprises simultaneously transmitting said amplified first and second transmit signals over said first and second respective antennas over the same frequency.

17. The method of claim 13, wherein amplifying said second transmit signal consists essentially of amplifying said second transmit signal using said fractional power amplifier.

18. The method of claim 13, wherein said fractional power is substantially one half of the specification power limit of the wireless device.

19. A mobile wireless communication device comprising:
a signal modifier to receive an input signal and produce a first transmit signal differing by a phase difference from a second transmit signal; and a transmit amplifier stage operable to amplify said first and second transmit signals, comprising:
a first channel comprising at least one full power amplifier operable to provide power to amplify the first transmit signal for transmission by a first antenna at a full power, the full power being a specification power limit of the wireless device, wherein a substantially maximum efficiency of the first power amplifier substantially coincides with the full power; and a second channel comprising at least one second power amplifier operable to amplify the second transmit signal for transmission by a second antenna at a fractional power, the second fractional power being a fraction of the specification power limit of the wireless device, wherein a substantially maximum efficiency of the second power amplifier substantially coincides with the fractional power, wherein said signal modifier is further to produce said phase difference based on a feedback signal received from a receiver of said first and second transmit signals.

20. The wireless communication device of claim 19, wherein said second channel consists essentially of said fractional power amplifier.

21. The wireless communication device of claim 19, wherein said fractional power is less than half of said specification power limit of the wireless device.

22. The wireless communication device of claim 19, wherein said fractional power is a quarter of said specification power limit of the wireless device.

23. The wireless communication device of claim 19, wherein said first and second channels are operable to provide said respective first and second transmit signals for simultaneous transmission over the same frequency.

24. The wireless communication device of claim 19, wherein said second fractional power is substantially one half of said specification power limit of the wireless device.

25. A method for transmission of a signal by a mobile wireless communication device, comprising:
receiving an input signal for transmission;

producing based on said input signal a first transmit signal differing by a phase difference from a second transmit signal;

amplifying by a full power the first transmit signal for transmission by a first antenna, the full power being a specification power limit of the wireless device, said amplification of the first transmit signal performed by a full power amplifier having a substantially maximum efficiency that substantially coincides with the full power;

amplifying by a fractional power the second transmit signal for transmission by a second antenna, the fractional power being a fraction of the specification power limit of the wireless device, said amplification of the second transmit signal performed by a fractional power amplifier having a substantially maximum efficiency that substantially coincides with the fractional power;

transmitting said amplified first and second transmit signals, thereby producing transmission of said input signal by said full transmission power;

receiving a feedback signal from a receiver of said first and second transmit signals; and adjusting said phase difference based on said feedback signal.

26. The method of claim 25, wherein said fractional power is less than half of the specification power limit of the wireless device.

27. The method of claim 25, wherein said fractional power is one quarter of the specification power limit of the wireless device.

28. The method of claim 25, wherein transmitting said amplified first and second transmit signals comprises simultaneously transmitting said amplified first and second transmit signals over said first and second respective antennas over the same frequency.

29. The method of claim 25, wherein said fractional power is substantially one half of the specification power limit of the wireless device.

* * * * *